United States Patent [19]

Bizzak

[11] 4,201,148
[45] May 6, 1980

[54] POINTER AND SCALE INDICATING ASSEMBLY

[75] Inventor: Frank W. Bizzak, Elgin, Ill.

[73] Assignee: Motorola, Inc., Schaumburg, Ill.

[21] Appl. No.: 964,756

[22] Filed: Nov. 29, 1978

[51] Int. Cl.$^2$ .................. G01D 13/22; H03J 1/02
[52] U.S. Cl. .................. 116/241; 116/DIG. 6; 116/319
[58] Field of Search ........... 116/245, 261, 254, 271, 116/281, DIG. 6, 328, 319, 336, 320, 241; 58/126 D; 74/10.37

[56] References Cited

U.S. PATENT DOCUMENTS

| | | | |
|---|---|---|---|
| 2,660,147 | 11/1953 | Bowditch | 116/331 |
| 2,896,167 | 7/1959 | Huber | 116/DIG. 6 |
| 3,227,129 | 1/1966 | Frank | 116/245 |
| 3,525,313 | 8/1970 | Jordan | 116/319 X |

FOREIGN PATENT DOCUMENTS 402399 11/1933 United Kingdom ............ 116/DIG. 6

Primary Examiner—Daniel M. Yasich
Attorney, Agent, or Firm—Phillip H. Melamed; Melvin A. Klein; James W. Gillman

[57] ABSTRACT

A pointer and scale indicating assembly for a radio receiver is disclosed. A scale with indicia thereon is fixed to a radio receiver chassis and a pointer arm is movably mounted in the chassis to positions corresponding to the frequency to which the radio receiver is tuned. A resilient pointer rod is mounted on the pointer arm and has an end portion visually cooperating with the scale indicia to indicate the receiver frequency. The pointer rod is hand insertable onto the pointer arm and is attached thereto by having an end portion of the pointer rod cooperating with a raised surface and a holding projection of the pointer arm.

16 Claims, 4 Drawing Figures

POINTER AND SCALE INDICATING ASSEMBLY

BACKGROUND OF THE INVENTION

Many types of pointer assemblies are known for use in radio receivers. Generally these types of pointer assemblies comprise a frequency indicating scale or dial face which cooperates with an end portion of a pointer. The pointer is mounted to a pointer arm whose position within the radio receiver chassis corresponds to the frequency to which the radio is tuned. Examples of typical prior art pointer assemblies are shown in U.S. Pat. Nos. 3,756,191, 2,953,927 and 2,933,927, all of which are assigned to the same assignee as the present invention.

In some prior art pointer assemblies the pointer is soldered into a fixed position on the pointer arm. This is a time consuming process and also complicates the assembly of components in the pointer assembly. This is because the soldering operation must generally occur prior to installing the pointer arm and soldered pointer in the radio receiver thus making alignment of the pointer with the scale more complex. In addition, generally no provision is made for preventing the rotation of the pointer with respect to the pointer arm. This will result in misalignment of the pointer with respect to the dial scale. While some snap and twist pointer assemblies have been utilized, these assemblies also do not insure proper angular alignment of the pointer with respect to the dial scale and these assemblies require complex and costly locking structures.

SUMMARY OF THE INVENTION

An object of the present invention is to provide an improved pointer and scale indicating assembly in which a pointer is readily hand insertable onto a pointer arm.

Another object of the present invention is to provide an improved radio receiver having a pointer and scale indicating assembly in which a pointer is hand mountable onto a pointer arm with a minimum amount of complex and costly retaining structure.

In one embodiment of the present invention an improved pointer and scale indicating assembly is provided. The assembly comprises a chassis; scale means, with indicia thereon, fixedly mounted in said chassis; pointer arm means movably mounted in said chassis, the position of said pointer arm means with respect to said chassis corresponding to a quantity which it is desired to visually display; and pointer means mounted on said pointer arm means for integral movement therewith and having first and second end portions, said first end portion visually cooperating with said scale means to produce a visual indication of the position of said pointer arm means with respect to said chassis; wherein the improvement comprises said pointer arm means having a first planar surface with at least one holding projection rising thereabove and a raised surface including a ramp rising above said first planar surface, said second end portion of said pointer means being at least partially resilient and being hand insertable onto said pointer arm means with said projection holding a part of said second end portion of said pointer means and said raised surface contacting and flexing said second end portion of said pointer means to create a retaining force maintaining said second end portion in contact with said raised surface and said projection, thereby attaching said pointer means to said pointer arm means.

Preferably, the improved pointer and scale indicating assembly is utilized in a radio receiver in which the pointer arm means position with respect to the chassis is indicative of the frequency to which the radio receiver is tuned. Also preferably, the pointer means comprises a resilient rod having an elbow portion at the second end portion, and the raised surface on the pointer arm means comprises a ramp which terminates on a second planar surface that is parallel to the first planar surface. During the insertion of the pointer means onto the pointer arm means, a portion of the elbow sequentially contacts the ramp and then the second planar surface and this structure results in a relatively constant maximum retaining force being provided for holding the pointer means onto the pointer arm means. Additionally, a stop means projects above the second planar surface for limiting the insertion of the pointer means onto the pointer arm means and positions the first end portion at a desired distance in front of the dial scale.

In addition to the preferred structural embodiments discussed above, preferably the rod of the scale indicating assembly has a predetermined cross section with a flat exterior portion, and holding projections are provided on the pointer arm means which effectively form two sides of a predetermined mating cavity that receives the predetermined cross section rod and thereby prevent any rotation of the rod with respect to the pointer arm means. Preferably the cross section and cavity are triangular.

BRIEF DESCRIPTION OF THE DRAWINGS

For a more complete understanding of the invention reference should be made to the drawings, in which.

DESCRIPTION OF THE PREFERRED EMBODIMENT OF THE INVENTION

Figure 1:
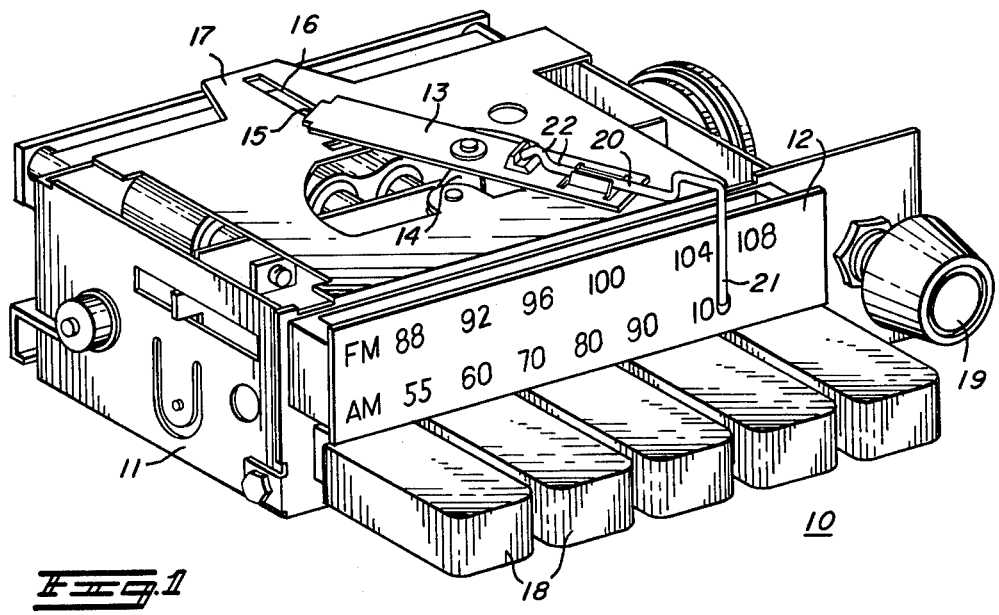
FIG. 1 is a perspective view of a radio receiver utilizing the improved pointer and scale indicating assembly of the present invention.
Figure 2:
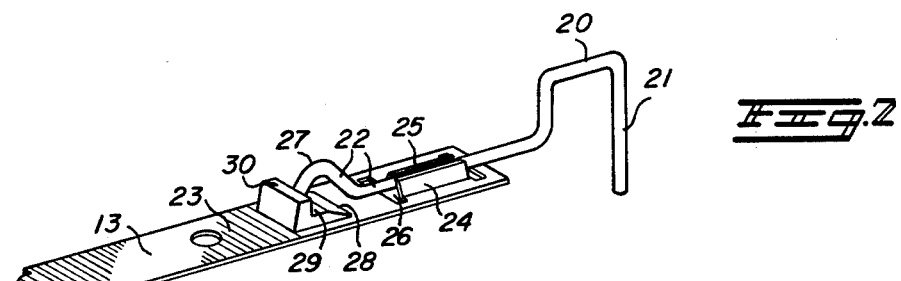
FIG. 2 is an enlarged perspective view of a pointer and pointer arm of the indicating assembly shown in FIG. 1.

Referring to FIG. 1, a pushbutton radio receiver 10 of the kind normally used in automobiles is illustrated. The radio receiver is shown without any external casing so as to more clearly illustrate the present invention. The radio receiver includes a chassis 11 on which the components of the receiver are mounted. A scale or dial 12 having frequency indicating indicia on a surface thereof is fixedly mounted to the chassis. A pointer arm 13 is pivotally attached to a crank member 14 that is pivoted to the chassis 11. The pointer arm 13 has a projection 15 which extends into a slot 16 in a plate 17 mounted to the chassis 11. Essentially, inward movement of any of a plurality of push-buttons 18 or rotational movement of a manual tuning knob 19 results in pivotal movement of a treadle bar assembly internal to the radio receiver and not shown which in turn results in moving the crank 14 to provide driving movement to the pointer arm 13. This type of structure provides substantially linear movement for a pointer attached to the pointer arm. The operation of these components is well known and one such similar prior art assembly is described and illustrated in U.S. Pat. No. 2,933,927.

Figure 4:
FIG. 4 is a cross-sectional view taken along the line 4—4 in FIG. 3.
Figure 3:
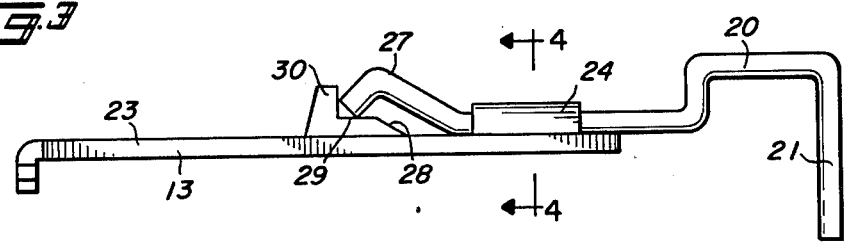
FIG. 3 is a sideview of the elements shown in FIG. 2.

A pointer 20 is mounted on the pointer arm 13 for integral movement therewith and has a first end portion 21 and a second end portion 22. The pointer arm 13 is located on one side of the surface of the scale 12 having indicia thereon and the first end portion 21 is located on an opposite side of the scale surface. The first end portion 21 visually cooperates with the indicia on the scale 12 to produce a visual indication of the frequency to which the radio receiver is tuned by producing a visual indication of the position of the pointer arm 13 with respect to the chassis 11. The pointer 20 essentially comprises a bent rod made of an at least partially resilient material and having a triangular cross section portion (see FIG. 4).

The pointer 20 is intended for hand insertion onto the pointer arm 13. The pointer arm is essentially a flat plate having a first planar surface 23 with holding projections (shear form edges) 24 and 25 that rise above the planar surface 23 and form two sides of a triangular cavity for matingly receiving the triangular cross section portion of the pointer and thereby effectively preventing rotation of the pointer with respect to the pointer arm. A through hole 26 is provided in the pointer arm 13 adjacent to the holding projections 24 and 25 to facilitate the insertion of an elbow portion 27 of the second end portion 22 of the pointer through the triangular cavity.

The pointer arm 13 has a raised surface which includes a ramp 28 rising above the first planar surface 26 and terminating on a second planar surface 29 which is above and substantially parallel with respect to the first planar surface 23. A stop projection 30 is provided which rises above the second planar surface 29 and limits the insertion of the pointer 20 onto the pointer arm 13 and positions the first end portion 21 at a desired distance in front of the dial scale 12.

Essentially, the pointer 20 is hand inserted onto the pointer arm 13 by pushing the second end portion 22 of the pointer which includes the elbow portion 27 through the opening 26 and the triangular cavity formed by the holding projections 24 and 25. The triangular cavity prevents rotation of the pointer 20 and as the pointer is inserted onto the arm 13 the elbow portion 27 rides up the ramp 28 and onto the second parallel surface 29. Further insertion of the pointer 20 results in the elbow portion 27 contacting the stop 30 thereby limiting further insertion of the pointer. The elements 28 through 30 form a raised surface with respect to the planar surface 23 and these structures in combination with the elbow portion 27 determine a predictable maximum retaining force which holds the pointer 20 in position on the arm 13 due to the flexing of the second end portion 22 of the pointer 20. The flexing of the portion 22 creates a retaining force which maintains the portion 22 in contact with the raised surface and the holding projections 24 and 25. Thus an improved and simplified pointer and scale indicating assembly has been provided which readily permits hand insertion of a pointer onto the pointer arm while controlling the retaining force holding the pointer onto the pointer arm and preventing pointer rotation with respect to the pointer arm.

While I have shown and described specific embodiments of this invention, further modifications and improvements will occur to those skilled in the art. All such modifications which retain the basic underlying principles disclosed and claimed herein are within the scope of this invention.

I claim:
1. An improved pointer and scale indicating assembly comprising:
   scale means, with indicia thereon, fixedly mounted in said chassis;
   pointer arm means moveably mounted in said chassis, the position of said pointer arm means with respect to said chassis corresponding to a quantity which it is desired to visually display; and
   pointer means mounted on said pointer arm means for integral movement therewith and having first and second end portions, said first end portion visually cooperating with said scale means to produce a visual indication of the position of said pointer arm means with respect to said chassis;
   wherein said scale means has a surface with said indicia thereon, said pointer arm means being located on one side of said scale surface and said first end portion of said pointer means being located on an opposite side of said scale surface;
   wherein the improvement comprises said pointer arm means having a first planar surface with at least one holding projection rising thereabove and a raised surface including a ramp rising above said first planar surface, said second end portion of said pointer means being at least partially resilient and being slidably hand insertable onto said pointer arm means with said projection holding a part of said second end portion of said pointer means and said ramp of said raised surface contacting and flexing said second end portion of said pointer means during the slidable hand insertion thereof to create a retaining force maintaining said second end portion in contact with said raised surface and said projection, thereby attaching said pointer means to said pointer arm means.

2. An improved pointer and scale indicating assembly according to claim 1 wherein said pointer arm means generally comprises a formed flat plate with said projection being an integral part thereof.

3. An improved pointer and scale indicating assembly according to claim 2 wherein said pointer means essentially comprises a bent rod.

4. An improved pointer and scale indicating assembly according to claims 1 or 3 wherein said second end portion of said pointer means has an elbow portion and said ramp on said pointer arm means rises above said first planar surface and terminates on a second planar surface raised above and substantially parallel with respect to said first planar surface, a portion of said elbow sequentially contacting said ramp and then said second planar surface during the insertion of said pointer means onto said pointer arm means, whereby a relatively constant maximum retaining force for said pointer means is obtained.

5. An improved pointer and scale indicating assembly according to claim 4 wherein said raised surface of said pointer arm means includes a stop means rising above said second planar surface for limiting further insertion of said pointer means onto said pointer arm means and for positioning the first end portion at a desired distance with respect to the scale means.

6. An improved pointer and scale indicating assembly according to claim 4 wherein said point arm means has a through hole located adjacent said projection for facilitating the insertion of said elbow of said pointer second end portion about said projection.

7. An improved pointer and scale indicating assembly according to claim 5 wherein said pointer means has a portion with a predetermined cross section having an exterior flat portion, and said pointer arm means holding projection cooperates with said pointer arm means to effectively form at least two sides of a mating predetermined cavity which contains said predetermined cross section portion of said pointer means after insertion of the pointer means onto to said pointer arm means, the predetermined cavity effectively preventing rotation of said pointer means with respect to said pointer arm means.

8. An improved pointer and scale indicating assembly according to claim 1 wherein said pointer means has a portion with a predetermined cross section having an exterior flat portion, and said pointer arm means holding projection cooperates with said pointer arm means to effectively form at least two sides of a mating predetermined cavity which contains said predetermined cross section portion of said pointer means after insertion of the pointer means onto to said pointer arm means, the predetermined cavity effectively preventing rotation of said pointer means with respect to said pointer arm means.

9. An improved pointer and scale indicating assembly according to claim 8 wherein said predetermined cross section and said predetermined cavity are triangular.

10. An improved pointer and scale indicating assembly according to claim 9 wherein said pointer arm means holding projection cooperates with another pointer arm means holding projection to form said triangular cavity.

11. A radio receiver including an improved pointer and scale indicating assembly comprising:
    a chassis;
    scale means, with indicia thereon, fixedly mounted in said chassis, said indicia indicating the frequencies to which the radio receiver is tunable;
    pointer arm means movably mounted in said chassis, the position of said pointer arm means with respect to said chassis corresponding to the frequency to which said radio receiver is tuned; and
    pointer means mounted on said pointer arm means for integral movement therewith and having first and second end portions, said first end portion visually cooperating with said scale indicia to produce a visual indication of the frequency to which said radio receiver is tuned
    wherein said scale means has a surface with said indicia thereon, said pointer arm means being located on one side of said scale surface and said first end portion of said pointer means being located on an opposite side of said scale surface;
    wherein the improvement comprises said pointer arm means having a first planar surface with at least one holding projection rising thereabove and a raised surface including a ramp rising above said planar surface, said second end portion of said pointer means being at least partially resilient and being slidably hand insertable onto said pointer arm means with said projection holding a part of said second end portion of said pointer means and said ramp of said raised surface contacting and flexing said second end portion of said pointer means during the slidable hand insertion thereof to create a retaining force maintaining said second end portion in contact with said raised surface and said projection, thereby attaching said pointer means to said pointer arm means.

12. A radio receiver according to claim 11 wherein said pointer means has a portion with a predetermined cross section having an exterior flat portion and said pointer arm means holding projection cooperates with said pointer arm means to effectively form at least two sides of a mating predetermined cavity which contains said predetermined cross section portion of said pointer means after insertion of the pointer means onto to said pointer arm means, the predetermined cavity effectively preventing rotation of said pointer means with respect to said pointer arm means.

13. A radio receiver according to claim 11 wherein said pointer arm means is pivotally attached to a crank that is pivoted to said chassis and said pointer arm means has a projection extending into a slot in a plate fixed to said chassis for guiding the movement of said pointer arm means, whereby pivotal driving movement by said crank results in substantially linear movement of said pointer first end portion.

14. A radio receiver according to claim 13 wherein said pointer means essentially comprises a bent rod and wherein said second end portion of said pointer means has a elbow portion and said ramp on said pointer arm means rises above said first planar surface and terminates on a second planar surface raised above and substantially parallel with respect to said first planar surface, a portion of said elbow portion sequentially contacting said ramp and then said second planar surface during the insertion of said pointer means onto said pointer arm means, whereby a relatively constant maximum retaining force for said pointer means is obtained.

15. A radio receiver according to claim 14 wherein said raised surface of said pointer arm means includes a stop means rising above said second planar surface for limiting further insertion of said pointer means onto said pointer arm means for positioning the first end portion at a desired distance in front of the scale.

16. A radio receiver according to claim 15 wherein said pointer means has a portion with a triangular cross section and said pointer arm means holding projection cooperates with another pointer arm means projection to effectively form at least two sides of a triangular cavity which contains said triangular portion of said pointer means after insertion of the pointer means onto to said pointer arm means, the triangular cavity effectively preventing rotation of said pointer means with respect to said pointer arm means.

* * * * *